(12) United States Patent
Nagai

(10) Patent No.: US 10,211,086 B2
(45) Date of Patent: Feb. 19, 2019

(54) SEMICONDUCTOR STRUCTURE CAPABLE OF IMPROVING ROW HAMMER EFFECT IN DYNAMIC RANDOM ACCESS MEMORY AND FABRICATION METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/865,267

(22) Filed: Jan. 9, 2018

(65) Prior Publication Data

US 2018/0286742 A1    Oct. 4, 2018

(30) Foreign Application Priority Data

Mar. 30, 2017    (CN) .......................... 2017 1 0201850

(51) Int. Cl.
*H01L 29/06* (2006.01)
*H01L 21/761* (2006.01)
*H01L 21/762* (2006.01)
*H01L 27/108* (2006.01)
*H01L 21/8234* (2006.01)

(52) U.S. Cl.
CPC ...... *H01L 21/761* (2013.01); *H01L 21/76224* (2013.01); *H01L 21/823481* (2013.01); *H01L 27/10814* (2013.01); *H01L 27/10876* (2013.01); *H01L 27/10891* (2013.01); *H01L 29/0649* (2013.01); *H01L 2924/14* (2013.01)

(58) Field of Classification Search
CPC ............. H01L 21/761; H01L 21/76224; H01L 21/823481; H01L 27/10814; H01L 27/10876; H01L 27/10891; H01L 29/0649
See application file for complete search history.

(56) References Cited

U.S. PATENT DOCUMENTS 4,791,462 A * 12/1988 Blanchard ........... H01L 29/7832
257/260
5,021,845 A * 6/1991 Hashimoto ......... H01L 29/1037
257/331
(Continued)

OTHER PUBLICATIONS

Yang, Suppression of Row Hammer Effect by Doping Profile Modification in Saddle-Fin Array Devices for sub-30-nm DRAM Technology, IEEE Electron Device Letters, 2016.
(Continued)

*Primary Examiner* — Mark W Tornow
(74) *Attorney, Agent, or Firm* — Winston Hsu

(57) ABSTRACT

A semiconductor structure includes a substrate with a first conductivity type and a first doping concentration, an active area with its longitudinal axis extending along a first direction, a trench isolation structure contiguous with an end surface of the active area, a passing gate in the trench isolation structure and extending along a second direction that is not parallel with the first direction, and a localized doping region with a second conductivity type and a second doping concentration that is located on the end surface.

10 Claims, 3 Drawing Sheets

(56) References Cited

U.S. PATENT DOCUMENTS

| | | | | |
|---|---|---|---|---|
| 5,917,216 | A | * | 6/1999 | Floyd .................. H01L 29/7813 257/330 |
| 6,803,626 | B2 | * | 10/2004 | Sapp ................... H01L 29/0634 257/329 |
| 6,828,202 | B1 | | 12/2004 | Horch |
| 7,767,562 | B2 | | 8/2010 | Tews |
| 2008/0048186 | A1 | * | 2/2008 | Cheng ............... H01L 27/10841 257/48 |
| 2016/0204201 | A1 | | 7/2016 | Oh |

OTHER PUBLICATIONS

Lee, DRAM Life Extension Challenge and Response, 2015 IEDM Short Course, Dec. 6, 2015.

* cited by examiner

SEMICONDUCTOR STRUCTURE CAPABLE OF IMPROVING ROW HAMMER EFFECT IN DYNAMIC RANDOM ACCESS MEMORY AND FABRICATION METHOD THEREOF

CROSS REFERENCE TO RELATED APPLICATION

This application claims the priority from CN application No. 201710201850.1, filed Mar. 30, 2017, which is included in its entirety herein by reference.

BACKGROUND OF THE INVENTION

1. Field of the Invention

The present invention relates to the field of semiconductor technology, and more particularly, to a semiconductor structure capable of improving the row hammer phenomenon of a dynamic random access memory (DRAM) and a method of fabricating the same.

2. Description of the Prior Art

When the target row of a DRAM is activated too many times over a period of time, the data stored in adjacent rows of the target row is likely to be lost or interfered with. More specifically, the data stored in adjacent rows may be corrupted by signal crosstalk due to the frequent activation of the target row. This phenomenon is also called "row hammer".

With the increase of DRAM design density, the phenomenon of row hammer will become more and more serious, which has become an urgent problem to be solved in this technical field.

SUMMARY OF THE INVENTION

The main object of the present invention is to provide an improved semiconductor structure and a method of fabricating the same to overcome the deficiencies and disadvantages of the prior art.

One embodiment of the present invention discloses a semiconductor structure including a substrate with a first conductivity type and a first doping concentration, an active area with its major axis extending along a first direction, a trench isolation structure contiguous with an end surface of the active area, a passing gate in the trench isolation structure and extending along a second direction that is not parallel with the first direction, and a localized doping region with a second conductivity type and a second doping concentration that is located on the end surface.

One embodiment of the present invention discloses a method for fabricating a semiconductor structure. A semiconductor substrate having a first conductivity type is provided. At least one active area is formed on the semiconductor substrate. A major axis of the active area extends along a first direction. A first oblique ion implantation process is performed to form a first doped region having a second conductivity type above a first depth on an end surface of the active area. A second oblique ion implantation process is performed to form a second doped region having a third conductivity type above a second depth on the end surface of the active area. The third conductivity type and the second conductivity types are opposite to each other, so that a localized doped region having the second conductivity type is formed between the first depth and the second depth. A trench isolation structure is formed around the active area and adjacent to the end surface of the active area.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Before further describing preferred embodiments, the specific terms used throughout the specification are described below.

The term "etch" is used herein generally to describe the process of patterning a material so that at least a portion of the material after the etch is completed can be remained. For example, a method of etching silicon typically involves patterning a photoresist layer over the silicon and then removing the silicon from areas that are not protected by the photoresist layer. As a result, the silicon in the area protected by the photoresist remains after the etching process is completed. However, in another example, etching may also refer to a method that does not use photoresist but leaves at least a portion of the material after the etching process is completed.

The above explanation is used to distinguish between "etching" and "removing". When a material is "etched", at least a portion of the material is retained after the treatment is completed. In contrast, when "removing" a material, essentially all of the material is removed during the process. However, in some embodiments, "removing" is considered a broad term and may include etching.

The terms "forming," "deposition," or the term "setting" are used hereinafter to describe the behavior of applying a layer of material to a substrate. Such terms are used to describe any possible layer formation technique including, but not limited to, thermal growth, sputtering, evaporation, chemical vapor deposition, epitaxial growth, electroplating and the like.

According to various embodiments, for example, deposition may be performed by any suitable well-known method. For example, deposition can include any process of growth, plating, or transfer of material onto a substrate. Some well-known technologies include physical vapor deposition (PVD), chemical vapor deposition (CVD), electrochemical deposition (ECD), molecular beam epitaxy (MBE), atomic layer deposition (ALD), plasma-enhanced CVD (PECVD), etc.

The term "substrate" described throughout the specification refers to the typical silicon substrate. However, the substrate can also be any semiconductor material such as germanium, gallium arsenide, indium phosphide and the like. In other embodiments, the substrate may be non-conductive, such as a glass or sapphire wafer.

Figure 1:
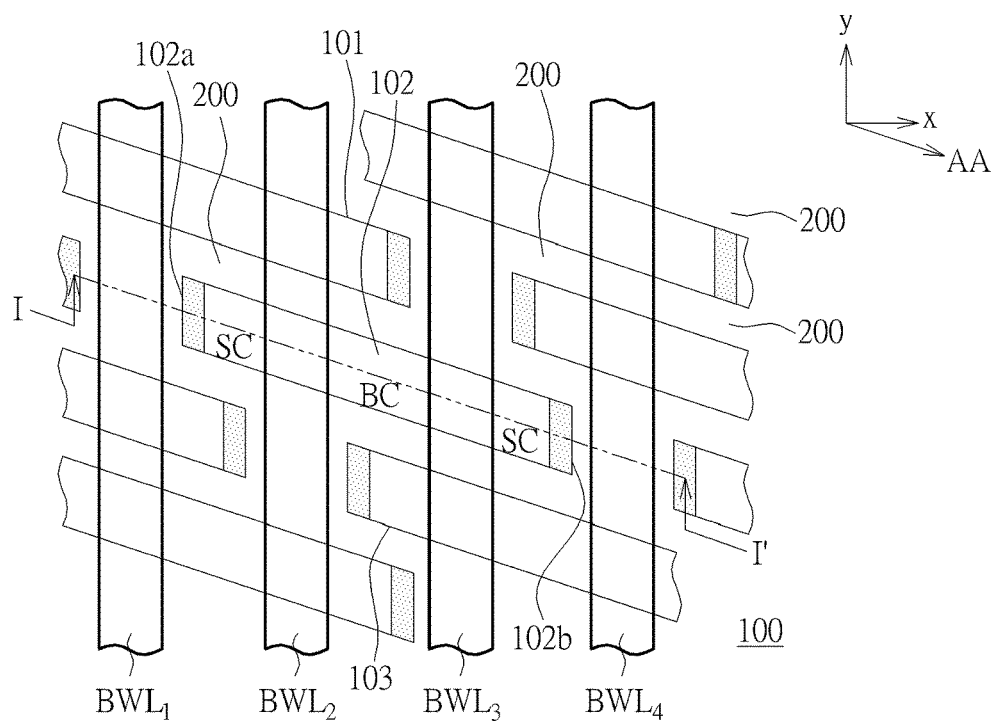
FIG. 1 is a partial layout diagram of a semiconductor structure according to an embodiment of the present invention.
Figure 2:
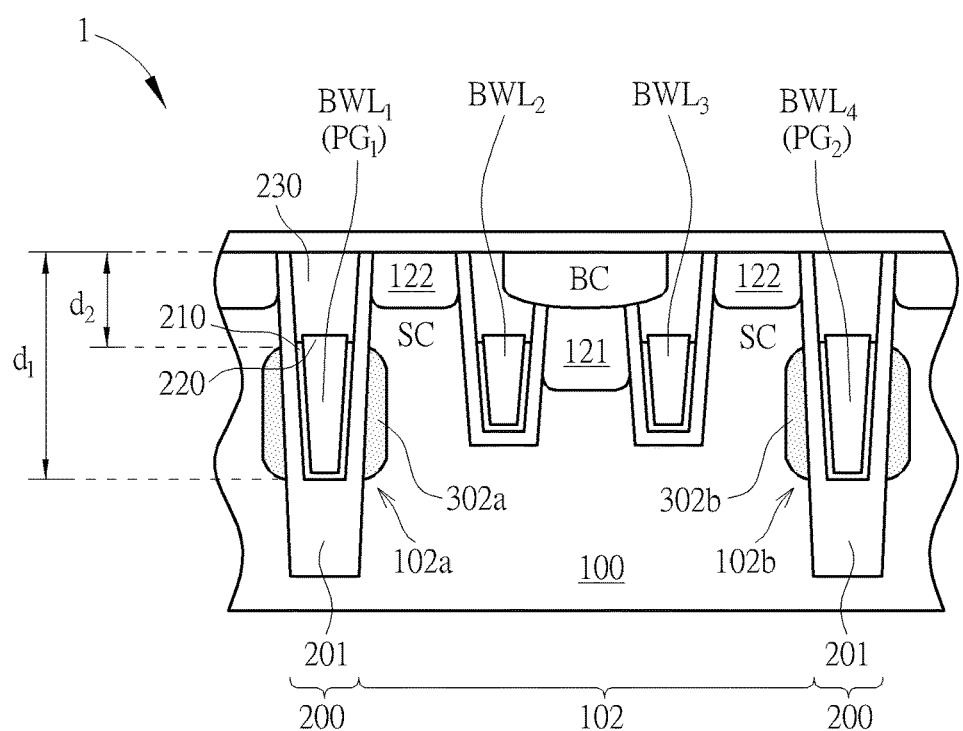
FIG. 2 is a cross-sectional view taken along the line I-I' in FIG. 1.

Referring to FIG. 1 and FIG. 2, wherein FIG. 1 is a partial layout diagram of a semiconductor structure 1 according to an embodiment of the present invention. FIG. 2 is a cross-sectional view taken along the line I-I' in FIG. 1. The semiconductor structure 1 of the present invention is particularly suitable for dynamic random access memory (DRAM) with embedded word lines, which can effectively improve the row hammer phenomenon of DRAM devices.

FIG. 1 illustrates a partial layout of a dynamic random access memory, which includes a plurality of active areas (AA) formed in a semiconductor substrate 100. Each active area is an elongated structure having a major axis along a first direction (or AA direction). According to an embodiment of the present invention, the plurality of active areas in FIG. 1 are arranged in a staggered manner. In other words, the active areas in different rows (for example, the active areas 101 and 102 or the active areas 102 and 103) partially overlap each other.

According to an embodiment of the present invention, a trench isolation structure 200 surrounds each of the active areas (e.g., active areas 101, 102, 103). The trench isolation structure 200 electrically insulates active areas 101, 102, 103 from each other. A plurality of buried word lines (BWLs), for example, $BWL_1$~$BWL_4$, are formed in the semiconductor substrate 100 and extend in a second direction (or a reference y-axis direction). The buried word lines $BWL_1$ to $BWL_4$ respectively pass through the plurality of active areas. For example, the buried word lines $BWL_2$ and $BWL_3$ pass through the active area 102, and the active area 102 is divided into three regions: namely a bit line contact region (BC) between $BWL_2$ and $BWL_3$, and storage node contact regions (SC) located at both ends of the active area 102.

According to an embodiment of the present invention, the buried word lines $BWL_1$ and $BWL_4$ pass through the trench isolation structure 200 beside the active area 102, respectively, and are in close proximity to opposite end surfaces 102a and 102b of the storage node contact region of the active area 102. According to the embodiment of the present invention, the buried word lines $BWL_1$ and $BWL_4$ close to the two opposite end surfaces 102a and 102b of the active area 102 and passing through the trench isolation structure 200 beside the active area 102 are also referred to as passing gates (PG).

As shown in FIG. 2, the semiconductor substrate 100 may include, but not limited to, a silicon substrate, a silicon-containing substrate, a gallium nitride on silicon (GaN-on-silicon or other material of the group III-V), a graphene-on-silicon substrate, or a silicon-on-insulator (SOI) substrate. According to an embodiment of the present invention, the semiconductor substrate 100 has a first conductivity type, such as P-type doping, and a first doping concentration, for example, ranging from 1E18 to 2E19 atoms/cm³, but is not limited thereto.

According to an embodiment of the present invention, the trench isolation structure 200 surrounds the active area 102 and abuts the end surfaces 102a and 102b of the active area 102. Each trench isolation structure 200 includes a trench-fill silicon oxide layer 201 and a passing gate PG buried in the trench-fill silicon oxide layer 201, for example, passing gates $PG_1$ or $PG_2$. According to an embodiment of the present invention, the passing gates PG are buried between the first depth $d_1$ and the second depth $d_2$, wherein the first depth $d_1$ is between 30 and 1000 Å and the second depth $d_2$ is between 5 and 500 Å.

According to an embodiment of the present invention, each passing gate PG includes a barrier layer 210 such as a titanium nitride layer, and a tungsten metal layer 220, but is not limited thereto. According to an embodiment of the present invention, a capping dielectric layer 230 may be formed on the passing gate PG. According to an embodiment of the present invention, a silicon thin film (not shown) may be disposed between the passing gate PG and the semiconductor substrate 100.

According to the embodiment of the present invention, a doped region 121 is formed in the bit line contact region (BC) between the buried word lines $BWL_2$ and $BWL_3$ and has a second conductivity type such as N type. According to an embodiment of the present invention, the doped region 121 is an N⁻ doped region. A doped region 122 is formed in the storage node contact region (SC) at both ends of the active area 102 and has a second conductivity type such as N type. According to an embodiment of the present invention, the doped region 122 is an N⁻ doped region.

According to an embodiment of the present invention, the depth of the bottom of the passing gates $PG_1$ or $PG_2$ is approximately equal to the first depth $d_1$, and is slightly deeper than the depth of the bottom of the buried word lines $BWL_2$ and $BWL_3$.

According to an embodiment of the present invention, the semiconductor structure 1 of the present invention includes localized doped regions 302a and 302b having a second conductivity type and a second doping concentration, respectively disposed on the two opposite end surfaces 102a and 102b of the active area 102. According to an embodiment of the present invention, the localized doped regions 302a and 302b extend only between the first depth $d_1$ and the second depth $d_2$ of the end surfaces 102a and 102b and directly face the passing gates $PG_1$ and $PG_2$, respectively.

According to an embodiment of the present invention, the localized doped regions 302a and 302b remain at a distance from the doped regions 122 formed in the storage node contact regions (SC) at the two ends of the active area 102 and are not in direct contact with each other.

According to an embodiment of the present invention, the localized doped regions 302a and 302b have a second conductivity type and a second doping concentration, wherein the second conductivity type is P type. For example, the localized doped regions 302a and 302b are doped with indium. The second doping concentration is between 1E18 and 5E19 atoms/cm³. According to an embodiment of the present invention, the second doping concentration of the localized doping regions 302a and 302b is greater than the first doping concentration of the semiconductor substrate 100, thereby reducing the electrical coupling between the passing gates $PG_1$ and $PG_2$ and the end surfaces 102a and 102b (lower Q).

According to another embodiment of the present invention, the localized doped regions 302a and 302b have a second conductivity type and a second doping concentration, wherein the second conductivity type is P type. For example, the localized doped regions 302a and 302b are doped with indium. The second doping concentration is between 1E18 and 5E19 atoms/cm³. According to an embodiment of the present invention, the second doping concentration of the localized doping regions 302a and 302b is less than the first doping concentration of the semiconductor substrate 100.

According to still another embodiment of the present invention, the localized doped regions 302a and 302b have a second conductivity type and a second doping concentration, wherein the second conductivity type is N type. For example, the localized doped regions 302a and 302b are doped with arsenic. The second doping concentration is between 1E18 and 5E19 atoms/cm$^3$.

Please refer to FIG. 3 to FIG. 6, which are cross-sectional views showing a method for fabricating a semiconductor structure according to an embodiment of the present invention.

Figure 3:
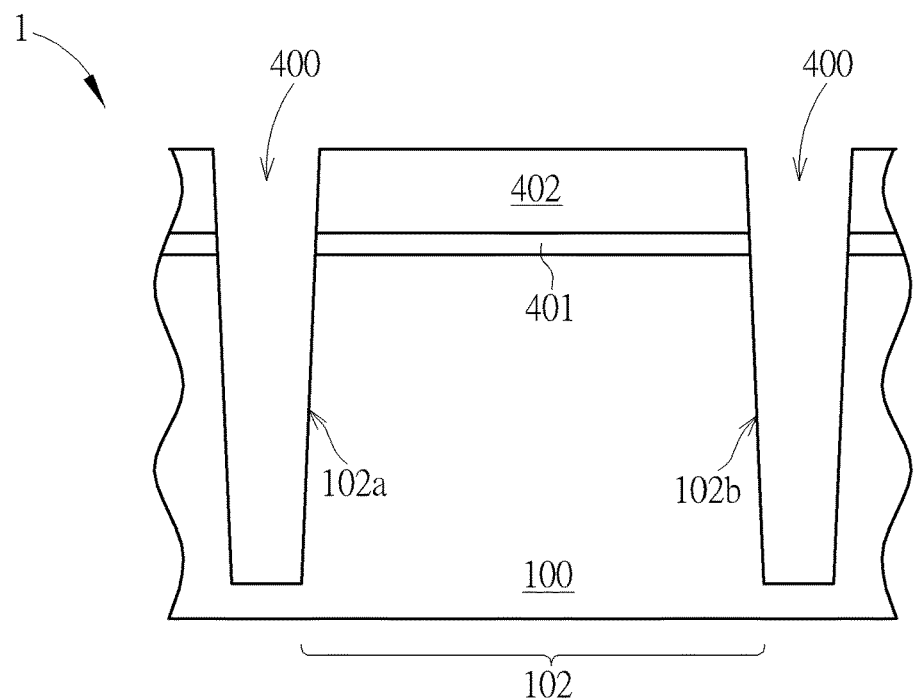
FIG. 3 to FIG. 6 are cross-sectional views showing a method for fabricating a semiconductor structure according to an embodiment of the present invention.

First, as shown in FIG. 3, a semiconductor substrate 100 is provided having a first conductivity type such as P-type doping. At least one active area 102 and an isolation trench 400 surrounding the active area 102 are formed on the semiconductor substrate 100. The major axis of the active area 102 extends along the first (or AA) direction (as shown in FIG. 1). FIG. 3 shows the intermediate semiconductor structure that has just completed trench etching and has not been filled with a silicon oxide layer in the isolation trenches 400. At this point, there is still a silicon oxide pad layer 401 and a silicon nitride layer 402 on the active area 102.

Figure 4:
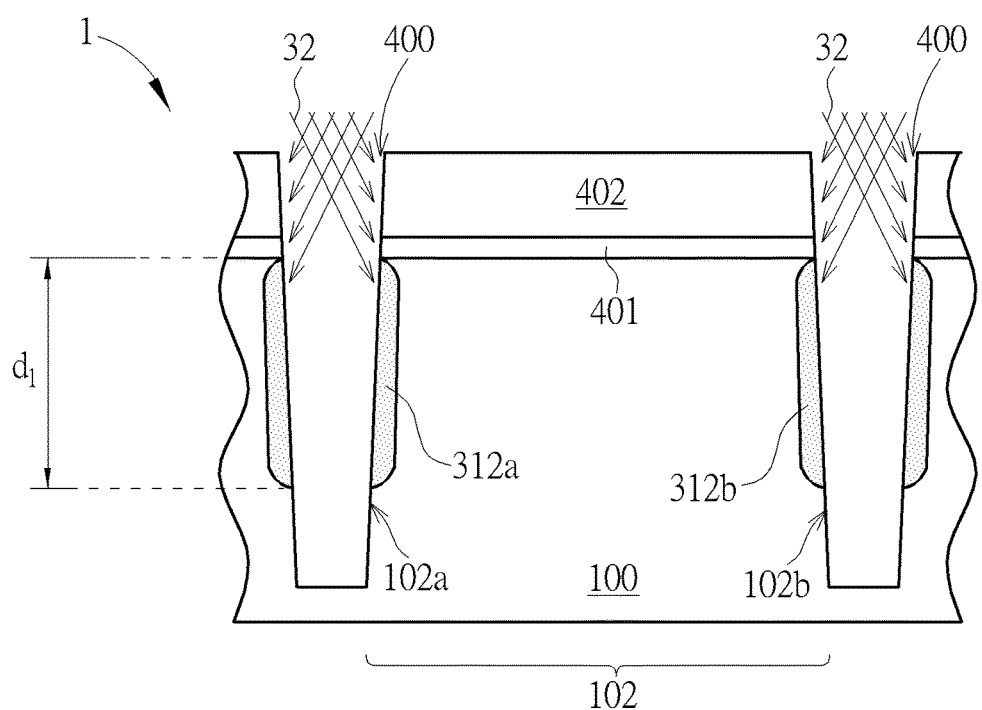

As shown in FIG. 4, a first oblique (or tilt-angle) ion implantation process 32 is performed. By utilizing the shadow effect of the silicon nitride layer 402, first doped regions 321a and 321b have a second conductivity type are formed above a first depth $d_1$ on the two opposite end surfaces 102a and 102b of the active area 102 in a self-aligned manner. According to an embodiment of the present invention, the first depth $d_1$ may range between 30 and 1000 Å. According to an embodiment of the present invention, the ion implantation directions of the first oblique ion implantation process 32 are parallel to the first (or AA) direction. For example, the implantation angle (the angle between the dopant incidence direction and the horizontal plane) is 40°.

Figure 5:
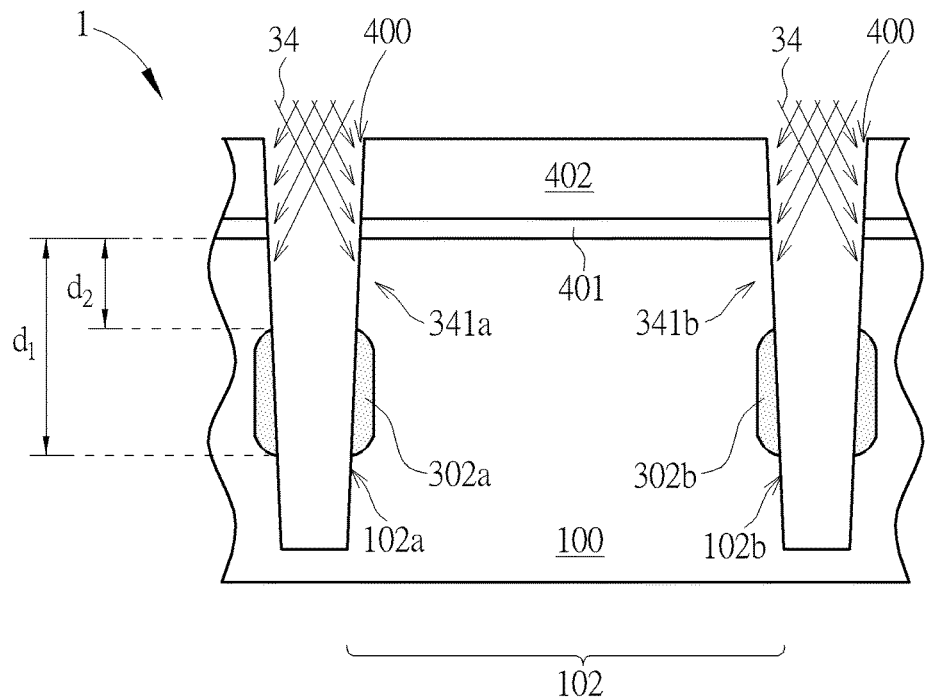

As shown in FIG. 5, a second oblique ion implantation process 34 is then performed. Again, utilizing the shadow effect of the silicon nitride layer 402 to form second doped regions 341a and 341b having a third conductive type above a second depth $d_2$ on the two opposite end surfaces 102a and 102b of the active area 102 in a self-aligned manner. The second conductive type of the first doped regions 321a and 321b is opposite to the third conductive type of the second doped regions 341a and 341b. Therefore, the localized doped regions 302a and 302b having the second conductivity type are formed between the first depth $d_1$ and the second depth $d_2$. According to an embodiment of the present invention, the second depth $d_2$ is between 5 and 500 Å. According to the embodiment of the present invention, the ion implantation directions of the second oblique ion implantation process 34 are all parallel to the first (or AA) direction. For example, the implantation angle (the angle between the dopant incidence direction and the horizontal plane) is 29°.

According to an embodiment of the present invention, for example, the dopant of the first oblique ion implantation process 32 is indium, the ion implantation energy is 10 keV, and the ion implantation dosage is 1E13 atoms/cm$^2$. The dopant of the second oblique ion implantation process 34 is arsenic, the ion implantation energy is 10 keV, and the ion implantation dose is 1E13 atoms/cm$^2$.

According to another embodiment of the present invention, for example, the dopant of the first oblique ion implantation process 32 is arsenic, the ion implantation energy is 10 keV, the ion implantation dosage is 1E13 atoms/cm$^2$. The dopant of the second oblique ion implantation process 34 is indium, the ion implantation energy is 10 keV, and the ion implantation dose is 1E13 atoms/cm$^2$.

Figure 6:
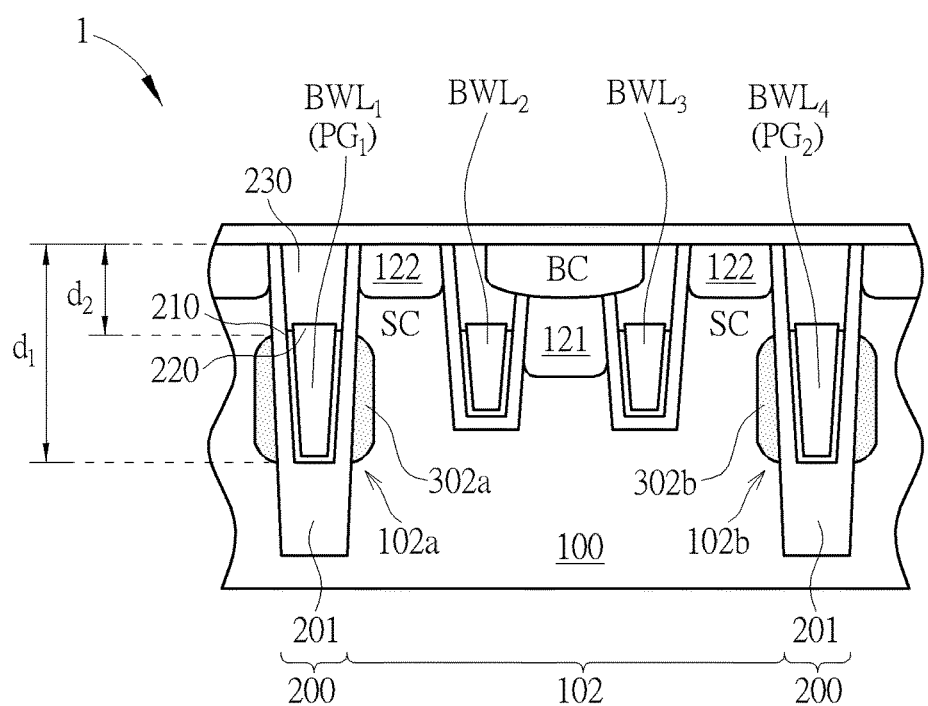

As shown in FIG. 6, a trench isolation structure 200 is then formed around the active area 102. The trench isolation structure 200 is formed by filling a silicon oxide layer 201 in the trench 400 by chemical vapor deposition. The silicon oxide layer 201 is contiguous with the end surfaces 102a and 102b of the active area 102. Next, trenches for forming the buried word line are formed in the semiconductor substrate 100 by a photolithography process and an etching process, and buried word lines (including passing gates) are formed in the trenches. The capping dielectric layer 230 is then formed to cover buried word lines. The subsequent steps for forming a bit line contact structure, a storage node contact structure, a bit line, a capacitor structure and the like are well-known in the art, and thus will not be described any further.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a semiconductor substrate having a first conductivity type and a first doping concentration;
   an active area on the semiconductor substrate, wherein a longest axis of the active area extends in a first direction;
   a trench isolation structure being in contiguous with one end surface of the active area;
   a passing gate buried in the trench isolation structure, wherein the longest axis of the passing gate extends along a second direction, and the second direction is not parallel nor perpendicular to the first direction;
   a localized doped region having a second conductivity type and a second doping concentration disposed on the end surface of the active area; and
   a capping dielectric layer disposed above the passing gate, wherein the trench isolation structure includes a trench-fill silicon oxide layer, with a portion of the trench-fill silicon oxide layer not directly contacting the passing gate, but directly contacting the capping dielectric layer.

2. The semiconductor structure according to claim 1, wherein the first conductivity type is P type and the second conductivity type is P type.

3. The semiconductor structure according to claim 1, wherein the localized doped region is doped with indium, wherein the second doping concentration is greater the first doping concentration.

4. The semiconductor structure according to claim 1 further comprising:
   a buried word line extending along the second direction and intersecting the active area, wherein a bottom surface of the buried word line and the bottom surface of the passing gate have different depths.

5. The semiconductor structure according to claim 1, wherein the first conductivity type is P type and the second conductivity type is N type.

6. The semiconductor structure according to claim 5, wherein the localized doped region is doped with arsenic.

7. The semiconductor structure according to claim 6, wherein the second doping concentration is between 1E18 and 5E19 atoms/cm$^3$.

8. The semiconductor structure according to claim 1, wherein the localized doped region extends only between a first depth and a second depth of the end surface and directly faces the passing gate.

9. The semiconductor structure according to claim 1, wherein the first depth is between 30 to 1000 Å and the second depth is between 5 to 500 Å.

10. The semiconductor structure according to claim 1, wherein the trench isolation structure comprises a silicon oxide layer between the localized doped region and the passing gate.

* * * * *